(12) United States Patent
Yasui et al.

(10) Patent No.: US 7,998,581 B2
(45) Date of Patent: Aug. 16, 2011

(54) SOLID PARTICLE EROSION RESISTANT SURFACE TREATED COATING AND ROTATING MACHINE APPLIED THEREWITH

(75) Inventors: Toyoaki Yasui, Hiroshima (JP); Yoshikazu Yamada, Hiroshima (JP); Shugo Iwasaki, Hiroshima (JP); Katsuyasu Hananaka, Hiroshima (JP); Kyoichi Ikeno, Hiroshima (JP)

(73) Assignee: Mitsubishi Heavy Industires, Ltd., Tokyo (JP)

( * ) Notice: Subject to any disclaimer, the term of this patent is extended or adjusted under 35 U.S.C. 154(b) by 457 days.

(21) Appl. No.: 12/085,223

(22) PCT Filed: Jan. 18, 2006

(86) PCT No.: PCT/JP2006/300579
§ 371 (c)(1),
(2), (4) Date: May 20, 2008

(87) PCT Pub. No.: WO2007/083361
PCT Pub. Date: Jul. 26, 2007

(65) Prior Publication Data
US 2009/0123737 A1    May 14, 2009

(51) Int. Cl.
*B32B 5/66*    (2006.01)
(52) U.S. Cl. ........ 428/403; 428/404; 428/548; 428/570; 428/650; 428/666; 427/212
(58) Field of Classification Search .......... 428/402, 428/403, 404, 548, 570, 650, 666; 427/212
See application file for complete search history.

(56) References Cited

U.S. PATENT DOCUMENTS

| 7,226,659 B2 * | 6/2007 | Misaki et al. | 428/336 |
| 7,449,253 B2 * | 11/2008 | Misaki et al. | 428/698 |
| 2005/0276990 A1 | 12/2005 | Kohara et al. | |

FOREIGN PATENT DOCUMENTS

| DE | 39 39 809 | | 6/1991 |
| DE | 3939809 | * | 6/1991 |
| DE | 102 10 839 | | 9/2002 |
| DE | 10210839 | * | 9/2002 |
| DE | 102 12 383 | | 10/2003 |
| DE | 10212383 | * | 10/2003 |
| EP | A0289173 | * | 2/1988 |
| EP | 0 289 173 | | 11/1988 |
| EP | A0605223 | * | 6/1994 |
| EP | 0 605 223 | | 7/1994 |
| JP | 63-038603 | | 2/1988 |
| JP | 01-139754 | | 6/1989 |
| JP | 06-221437 | | 8/1994 |
| JP | 10-148102 | | 6/1998 |
| JP | 2001-150500 | | 6/2001 |
| JP | 2002-188642 | | 7/2002 |
| JP | 2002-307129 | | 10/2002 |
| JP | 2004-332003 | | 11/2004 |
| JP | 2006-037212 | | 2/2006 |

OTHER PUBLICATIONS

M.Okymiya et alt "Mechanical properties and tribological behavior.. " SCT 112 (1999)pp. 123-128.*
International Search Report mailed Apr. 18, 2006 for International Application No. PCT/JP2006/300579.
German Office Action (with English translation) issued Sep. 30, 2010 in corresponding German Patent Application No. 11 2006 003 471. 5-45.
M. Okumiya and M.Griepentrog, *"Mechanical properties and tribological behavior of TiN-CrAlN and CrN-CrAlN multilayer coatings"*, Surface and Coatings Technology 112 (1999) pp. 123-128.

\* cited by examiner

*Primary Examiner* — Leszek Kiliman
(74) *Attorney, Agent, or Firm* — Wenderoth, Lind & Ponack, L.L.P.

(57) ABSTRACT

A solid particle erosion resistant surface treated coating has a solid particle erosion resistance that is largely enhanced and a rotating member having the coating gains oxidation resistance without deteriorating a fatigue strength. Also, a rotating machine can have this coating applied thereto. The solid particle erosion resistant surface treated coating has a nitrided hard layer formed on a surface of a base material and a PVD (physical vapor deposition) hard layer of at least one layer formed on the nitrided hard layer by a PVD method. Deformation of the base material by collisions by solid particles is prevented and cracking of the coating is prevented. Thereby, the solid particle erosion resistance is secured, life of the solid particle erosion resistant surface treated coating can be increased and oxidation resistance and fatigue strength are enhanced.

12 Claims, 4 Drawing Sheets

SOLID PARTICLE EROSION RESISTANT SURFACE TREATED COATING AND ROTATING MACHINE APPLIED THEREWITH

TECHNICAL FIELD

The present invention relates to a surface treated coating having a solid particle erosion resistance and also relates to a rotating machine with this surface treated coating applied thereto, such as a steam turbine, axial compressor or the like (such rotating machine is simply referred to as a rotating machine in the present specification and claims for patent as appended herein).

BACKGROUND OF THE INVENTION

In a steam turbine, as a base material of parts and components making direct contact with steam, a 12% chromium stainless steel, for example, is used. In order to improve a resistance against erosion caused by solid particles existing in the steam, in the case of stationary parts and components, a surface of the base material often has applied thereto a boronizing treatment in which a penetration diffusion treatment of boron is carried out.

However, in the case of the above-mentioned 12% chromium stainless steel, there is a problem in that the parts and components are damaged by erosion due to solid particles included in the steam, such as silica, iron oxide or the like, so that their life becomes shorter. In order to solve such a problem, the surface of the 12% chromium stainless steel may have applied thereto the boronizing treatment, as mentioned above. Nevertheless, even in this case, a sufficient resistance against erosion due to solid particles is hardly obtained so that the fatigue strength is deteriorated. Thus, there is a problem that the above-mentioned surface treatment is hardly applied to rotating members.

Moreover, in the part making contact with a high temperature steam in a steam turbine or the like, not only the solid particle erosion resistance but also a sufficient performance including the oxidation resistance, fatigue strength and the like is demanded.

Conventionally, as a high speed rotator, such as a dynamic pressure fluid bearing or the like, there is disclosed, as in the Patent Document 1 below, a proposal that a base material has applied thereto a hardening treatment and is then coated with a diamond-like carbon membrane so as to cope with damage to the high speed rotator due to impurities, such as metal powders or the like, generated by abrasions and also to cope with deterioration of the rotating performance and life. Nevertheless, if an application to the part making contact with steam in a steam turbine is considered, practicability and applicability of such a surface treated coating are still insufficient not only with respect to the solid particle erosion resistance but also with respect to the oxidation resistance, fatigue strength or the like.

Patent Document 1: Japanese laid-open patent application 2002-188642 (page 1, FIG. 1)

SUMMARY OF THE INVENTION

In order to solve the problems in the prior art as mentioned above, it is an object of the present invention to provide a solid particle erosion resistant surface treated coating by which an erosion resistance can be largely enhanced and even with a rotating member, a sufficient oxidation resistance is given without reducing the fatigue strength. It is also an object of the present invention to provide a rotating machine having applied thereto the solid particle erosion resistant surface treated coating.

In order to achieve the above-mentioned objects, the present invention provides means as mentioned in the following aspects (1) to (12):

(1) A first aspect of the present invention is a solid particle erosion resistant surface treated coating, characterized in that the solid particle erosion resistant surface treated coating comprises a nitrided hard layer formed on a surface of a base material and a PVD (physical vapor deposition) hard layer of at least one layer formed on the nitrided hard layer by a PVD method, the nitrided hard layer having a thickness of at least 30 μm and the PVD hard layer having a total thickness of at least 10 μm.

(2) A second aspect of the present invention is a solid particle erosion resistant surface treated coating as mentioned in the first aspect, characterized in that the nitrided hard layer is formed by a radical nitriding method.

(3) A third aspect of the present invention is a solid particle erosion resistant surface treated coating as mentioned in the first aspect, characterized in that the PVD hard layer is a CrN layer formed on the nitrided hard layer.

(4) A fourth aspect of the present invention is a solid particle erosion resistant surface treated coating as mentioned in the first aspect, characterized in that the PVD hard layer comprises a CrN layer formed on the nitrided hard layer and an AlCrN layer or TiAlN layer formed on the CrN layer.

(5) A fifth aspect of the present invention is a solid particle erosion resistant surface treated coating as mentioned in the first aspect, characterized in that the PVD hard layer comprises a TiN layer formed on the nitrided hard layer and a CrN layer formed on the TiN layer.

(6) A sixth aspect of the present invention is a solid particle erosion resistant surface treated coating as mentioned in the first aspect, characterized in that the PVD hard layer comprises a TiN layer formed on the nitrided hard layer and an AlCrN layer or TiAlN layer formed on the TiN layer.

(7) A seventh aspect of the present invention is a solid particle erosion resistant surface treated coating as mentioned in the first aspect, characterized in that the PVD hard layer is formed on the nitrided hard layer in a multi-layer form in which CrN layers and TiAlN layers are alternately layered.

(8) An eighth aspect of the present invention is a solid particle erosion resistant surface treated coating as mentioned in the first aspect, characterized in that the PVD hard layer is formed on the nitrided hard layer in a multi-layer form in which CrN layers and AlCrN layers are alternately layered.

(9) A ninth aspect of the present invention is a solid particle erosion resistant surface treated coating as mentioned in the first aspect, characterized in that the PVD hard layer is formed on the nitrided hard layer in a multi-layer form in which CrN layers and TiN layers are alternately layered.

(10) A tenth aspect of the present invention is a solid particle erosion resistant surface treated coating as mentioned in the first aspect, characterized in that the PVD hard layer is formed on the nitrided hard layer in a multi-layer form in which TiN layers and TiAlN layers are alternately layered.

(11) An eleventh aspect of the present invention is a solid particle erosion resistant surface treated coating as mentioned in the first aspect, characterized in that the PVD hard layer is formed on the nitrided hard layer in a multi-layer form in which TiN layers and AlCrN layers are alternately layered.

(12) A twelfth aspect of the present invention is a rotating machine, characterized in that a part that comes in contact with steam of the rotating machine has a surface having applied thereto the solid particle erosion resistant surface treated coating as mentioned in any one of the first to eleventh aspects.

In the course of extensive studies and tests for enhancing the solid particle erosion resistance, the inventors here have obtained an expertise that while the solid particle erosion resistance can be enhanced by applying a coat (PVD hard layer) that has a hardness higher than that of colliding particles, if a substrate (base material) of the coat is soft, the base material is deformed by collisions by the solid particles so that the upper PVD hard layer will crack by the deformation and this results in no enhancement of the erosion resistance.

According to the solid particle erosion resistant surface treated coating of the present invention made on the basis of the above-mentioned expertise, the following effects can be obtained:

(1) According to a first aspect of the invention, in order to enhance the solid particle erosion resistance of the PVD hard layer formed by the PVD method, the nitrided hard layer is formed on the surface of the base material so that the hardness of the substrate is increased. Moreover, the thickness of the nitrided hard layer is set to 30 µm or more so that the base material is prevented from being deformed by collisions by the solid particles and the coating comprising the nitrided hard layer formed on the base material and the PVD hard layer formed on the nitrided hard layer is prevented from cracking. Thus, the solid particle erosion resistance can be securely held. Also, the total thickness of the PVD hard layer is set to 10 µm or more so that the erosion resistance is prevented from being influenced by collisions by the solid particles and the life of the solid particle erosion resistant surface treated coating can be increased.

Further, by the combination of the nitrided hard layer and PVD hard layer as mentioned above, the oxidation resistance and fatigue strength can be enhanced and a solid particle erosion resistant surface treated coating that is preferably applied to a portion requiring strength in a rotating machine or the like can be obtained.

(2) According to a second aspect of the invention, in addition to the function and effect of first aspect of the invention, the nitrided hard layer is formed by the radical nitriding method. Thus, the nitrided hard layer so formed has no brittle degenerated layer and becomes strong against the fatigue characteristic. Hence, the fatigue strength can be enhanced as compared with the fatigue characteristic of the base material.

(3) In the PVD hard layer as the upper layer of the nitrided hard layer, in order to obtain the solid particle erosion resistance, it is important to make the hardness of the coating higher than the hardness of the colliding particles. As a representative material of the colliding solid particles, there is $SiO_2$ that has a Vickers hardness of 1000 to 1300. Hence, a layer of ceramic material that has a hardness higher than $SiO_2$ would be needed. Nevertheless, according to a third to sixth aspect of the present invention, CrN, TiAlN, AlCrN and TiN can satisfy the above-mentioned condition of the hardness. Hence, in addition to the function and effect of the first aspect of the invention, a definite structure of more preferable solid particle erosion resistant coating that is excellent in high temperature stability and toughness as compared with other ceramic materials can be obtained.

(4) According to a seventh to eleventh aspect of the invention, in addition to the function and effect of the first aspect of the invention and as in the third to sixth aspects of the invention, the CrN, TiAlN, AlCrN and TiN can satisfy the condition of the hardness. Moreover, a definite structure of more preferable solid particle erosion resistant coating that is excellent in high temperature stability and toughness as compared with other ceramic materials can be obtained. Also, by forming the PVD hard layer in the multi-layer form in which thin materials of two kinds are alternately layered, the anti-crack and anti-peeling ability can be enhanced as compared with the PVD hard layer of one-layer or two-layer form and the solid particle erosion resistance can be further enhanced.

According to a twelfth aspect of the invention, by the function and effect of any of the first to eleventh aspects of the invention, a steam turbine that has a high erosion resistance, oxidation resistance and fatigue strength and enables an increased life can be obtained.

DETAILED DESCRIPTION OF THE INVENTION

The present invention has been elaborated on the basis of extensive studies and tests for obtaining such a surface treated coating that, while maintaining a fatigue strength, has an oxidation resistance and can satisfy a need to enhance a solid particle erosion resistance and will be described next with reference to FIGS. 1 to 12, based on embodiments 1 to 12 as the best modes for carrying out the present invention.

Embodiment 1

Figure 1:
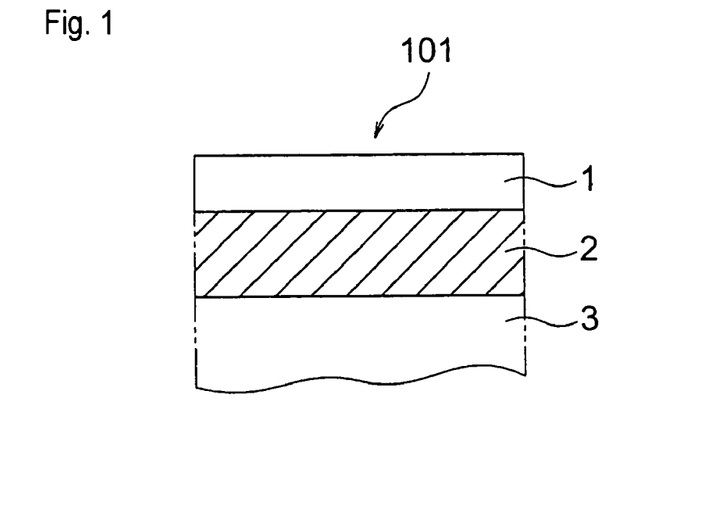
FIG. 1 is an explanatory cross sectional view of a solid particle erosion resistant surface treated coating 101 of embodiment 1 according to the present invention.

FIG. 1 is an explanatory cross sectional view of a solid particle erosion resistant surface treated coating 101 of the embodiment 1 according to the present invention. The solid particle erosion resistant surface treated coating 101 of the present embodiment is constructed by a nitrided hard layer 2 formed on a base material 3 and a PVD (physical vapor deposition) hard layer 1 formed on the nitrided hard layer 2 as a hard layer formed by the PVD method. Also, a steam turbine as a rotating machine according to the present invention has applied thereto the solid particle erosion resistant surface treated coating so constructed.

The nitrided hard layer 2 is preferably a radical nitrided layer formed by a radical nitriding method and its thickness is set to 30 μm or more, and preferably to 60 to 100 μm, in order to suppress a deterioration of the fatigue strength and enhance the solid particle erosion resistance. The PVD hard layer 1 formed thereon has a total thickness of 10 μm or more, preferably of 20 μm or more. In the case this thickness is less than 10 μm, the life of the layer becomes shorter because of collisions by the solid particles. On the other hand, the thickness of 25 μm or so will be a limit in view of the layer stress (membrane stress) at the time of forming the layer (membrane). Material of the PVD layer is selected from CrN (chromium nitride), TiN (titanium nitride), AlCrN (aluminum chromium nitride) and TiAlN (titanium aluminum nitride) and the layer is formed by one-layer of one material, two-layers of two materials or multi-layers of two materials, that is, multi-layers of a material "a" layer and another material "b" layer. The solid particle erosion resistant surface treated coating 101 so constructed can be effectively used for a rotating machine, such as a steam turbine, axial compressor or the like. It is to be noted that the term "rotating machine" as used in the present specification and claims for patent appended herein means such a rotating machine including a steam turbine, axial compressor or the like, for example.

Next, solid particle erosion resistant surface treated coatings of embodiments 2 to 12 according to the present invention will be described with reference to FIGS. 2 to 12.

Embodiment 2

Figure 2:
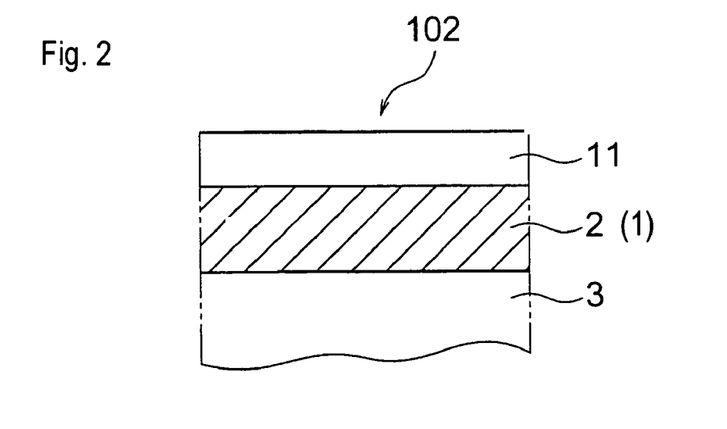
FIG. 2 is an explanatory cross sectional view of a solid particle erosion resistant surface treated coating 102 of embodiment 2 according to the present invention.

FIG. 2 is an explanatory cross sectional view of a solid particle erosion resistant surface treated coating 102 of the embodiment 2 according to the present invention. The solid particle erosion resistant surface treated coating 102 of the present embodiment is constructed by the nitrided hard layer 2, that is the same as described with respect to the embodiment 1, formed on the base material 3 and the PVD hard layer 1 that is a CrN layer 11 formed on the nitrided hard layer 2 by the PVD.

The nitrided hard layer 2 is a layer, having no degenerated layer, formed by the radical nitriding method and its thickness is set to 30 μm or more, preferably to 60 to 100 μm. If this thickness is less than 30 μm, in the environment where the solid particles collide, the upper PVD hard layer 1 together with the base material 3 is deformed at the time of collisions by the solid particles so that the upper PVD hard layer 1 may crack or peel off and this causes a problem of deterioration of the erosion resistance. The thickness of more than 100 μm has no physical property-wise problem but is practically disadvantageous because the manufacturing cost becomes high.

The CrN layer 11 as the upper PVD hard layer 1 of the present embodiment is formed, for example, by an arc type ion plating method and its thickness is set to 10 μm or more, and preferably to 20 μm or more. If this thickness is less than 10 μm, the life of the layer becomes shorter because of collisions by the solid particles. On the other hand, the thickness of 25 μm or so will be a limit in view of the layer stress (membrane stress) at the time of forming the layer (membrane).

Embodiment 3

Figure 3:
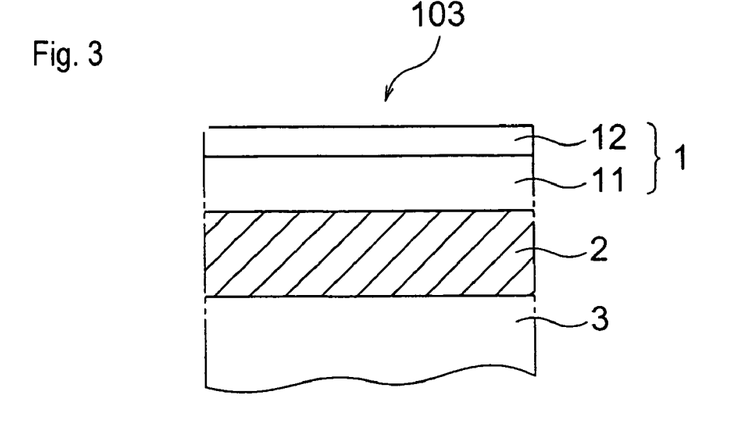
FIG. 3 is an explanatory cross sectional view of a solid particle erosion resistant surface treated coating 103 of embodiment 3 according to the present invention.

FIG. 3 is an explanatory cross sectional view of a solid particle erosion resistant surface treated coating 103 of the embodiment 3 according to the present invention. The solid particle erosion resistant surface treated coating 103 of the present embodiment is constructed by the nitrided hard layer 2, that is the same as described with respect to the embodiment 1, formed on the base material 3 and the PVD hard layer 1 comprising the CrN layer 11 likewise formed on the nitrided hard layer 2 by the PVD and a TiAlN layer 12 formed on the CrN layer 11 by the PVD. Like the CrN layer 11, the TiAlN layer 12 can be formed, for example, by the arc type ion plating method and its thickness is set to 1 to 6 μm.

Embodiment 4

Figure 4:
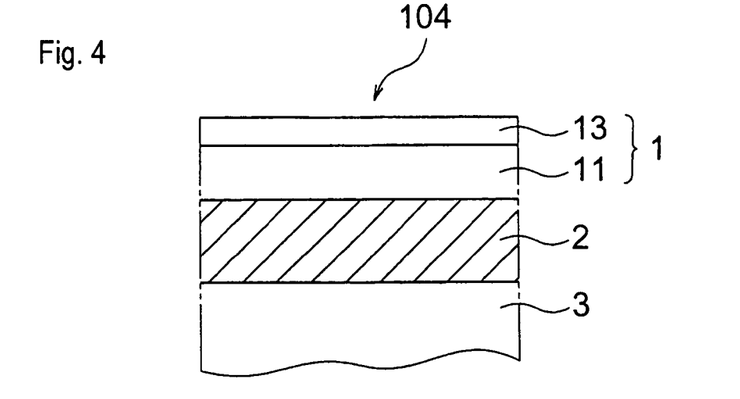
FIG. 4 is an explanatory cross sectional view of a solid particle erosion resistant surface treated coating 104 of embodiment 4 according to the present invention.

FIG. 4 is an explanatory cross sectional view of a solid particle erosion resistant surface treated coating 104 of the embodiment 4 according to the present invention. The solid particle erosion resistant surface treated coating 104 of the present embodiment is constructed by the nitrided hard layer 2, that is the same as described with respect to the embodiment 1, formed on the base material 3 and the PVD hard layer 1 comprising the CrN layer 11 likewise formed on the nitrided hard layer 2 by the PVD and an AlCrN layer 13 formed on the CrN layer 11 by the PVD. Like the CrN layer 11, the AlCrN layer 13 can be formed, for example, by the arc type ion plating method and its thickness is set to 1 to 6 μm.

Embodiment 5

Figure 5:
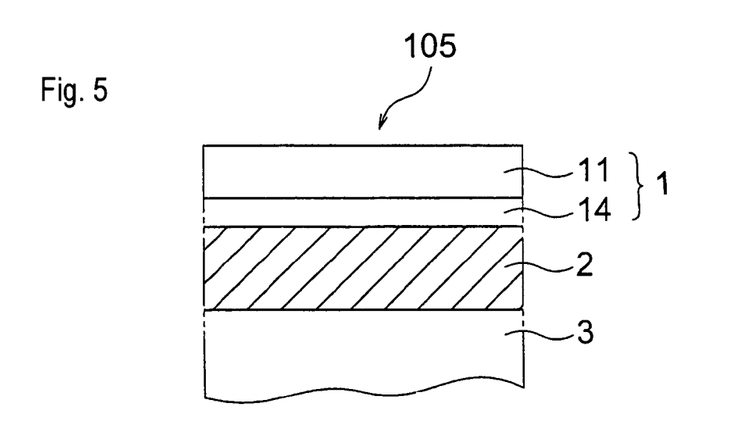
FIG. 5 is an explanatory cross sectional view of a solid particle erosion resistant surface treated coating 105 of embodiment 5 according to the present invention.

FIG. 5 is an explanatory cross sectional view of a solid particle erosion resistant surface treated coating 105 of the embodiment 5 according to the present invention. The solid particle erosion resistant surface treated coating 105 of the present embodiment is constructed by the nitrided hard layer 2, that is the same as described with respect to the embodiment 1, formed on the base material 3 and the PVD hard layer 1 comprising a TiN layer 14 of a thickness of 5 to 10 μm formed on the nitrided hard layer 2 by the PVD and the CrN layer 11 likewise formed on the TiN layer 14 by the PVD. Like the CrN layer 11, the TiN layer 14 can be formed, for example, by the arc type ion plating method.

Embodiment 6

Figure 6:
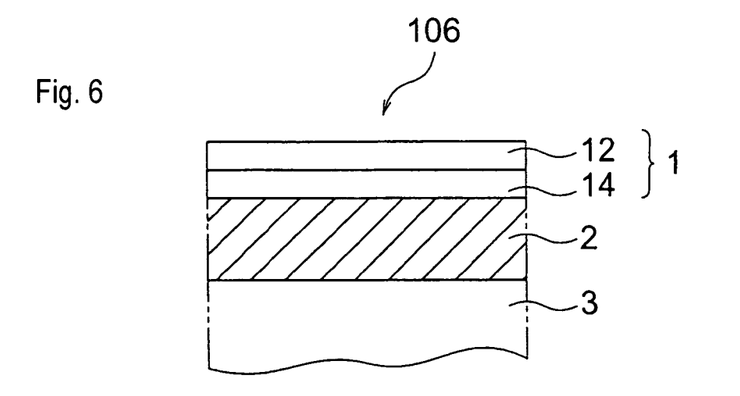
FIG. 6 is an explanatory cross sectional view of a solid particle erosion resistant surface treated coating 106 of embodiment 6 according to the present invention.

FIG. 6 is an explanatory cross sectional view of a solid particle erosion resistant surface treated coating 106 of the embodiment 6 according to the present invention. The solid particle erosion resistant surface treated coating 106 of the present embodiment is constructed by the nitrided hard layer 2, that is the same as described with respect to the embodiment 1, formed on the base material 3 and the PVD hard layer 1 comprising the TiN layer 14 of a thickness of 5 to 10 μm formed on the nitrided hard layer 2 by the PVD and the TiAlN layer 12 likewise formed on the TiN layer 14 by the PVD.

Embodiment 7

Figure 7:
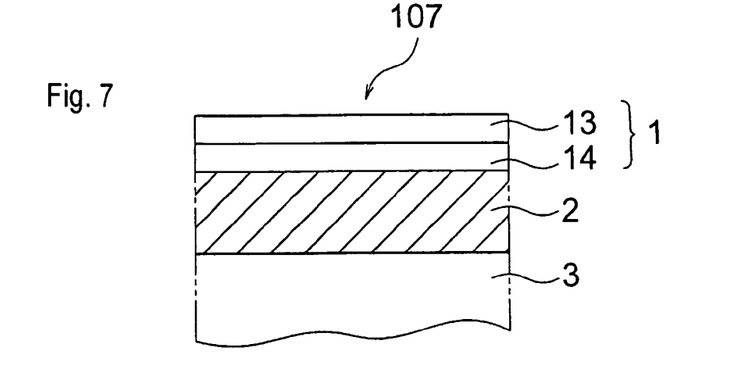
FIG. 7 is an explanatory cross sectional view of a solid particle erosion resistant surface treated coating 107 of embodiment 7 according to the present invention.

FIG. 7 is an explanatory cross sectional view of a solid particle erosion resistant surface treated coating 107 of the embodiment 7 according to the present invention. The solid particle erosion resistant surface treated coating 107 of the present embodiment is constructed by the nitrided hard layer 2, that is the same as described with respect to the embodiment 1, formed on the base material 3 and the PVD hard layer 1 comprising the TiN layer 14 of a thickness of 5 to 10 μm formed on the nitrided hard layer 2 by the PVD and the AlCrN layer 13 likewise formed on the TiN layer 14 by the PVD.

FIGS. 8 to 12 are explanatory views of solid particle erosion resistant surface treated coatings of embodiments 8 to 12 according to the present invention, in which the PVD hard layer 1 is formed in a multi-layer form of materials of two kinds.

Embodiment 8

Figure 8:
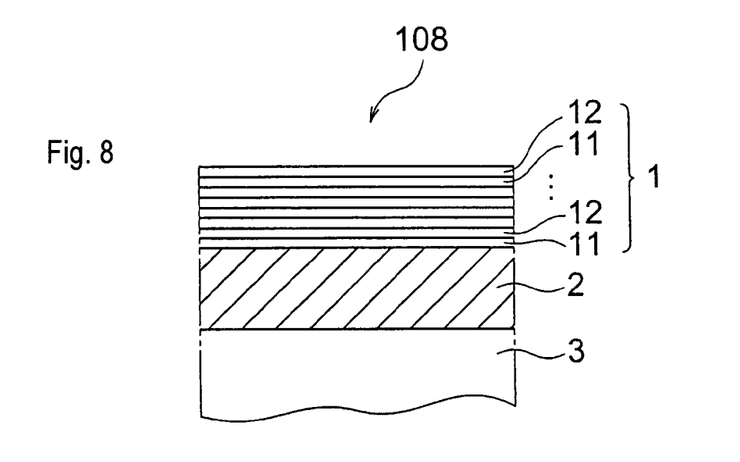
FIG. 8 is an explanatory cross sectional view of a solid particle erosion resistant surface treated coating 108 of embodiment 8 according to the present invention.

FIG. 8 is an explanatory cross sectional view of a solid particle erosion resistant surface treated coating 108 of the embodiment 8 according to the present invention. The solid particle erosion resistant surface treated coating 108 of the present embodiment is constructed by the nitrided hard layer 2, that is the same as described with respect to the embodiment 1, formed on the base material 3 and the PVD hard layer 1 that is formed thereon in a multi-layer form in which the CrN layers 11 and TiAlN layers 12 are alternately layered by the PVD. Thickness of each of the layers forming the PVD hard layer 1 can be set variously, for example, to 10 to 100 nm and the total thickness of the PVD hard layer 1 is 10 μm or more, and preferably 20 μm or more, as in the case of the embodiment 1.

Embodiment 9

Figure 9:
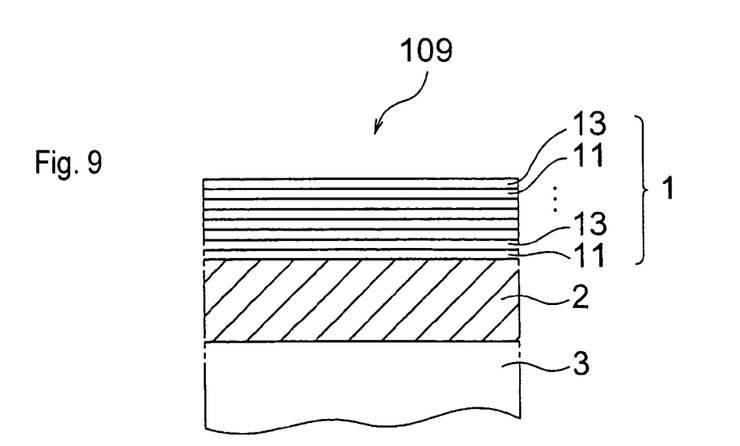
FIG. 9 is an explanatory cross sectional view of a solid particle erosion resistant surface treated coating 109 of embodiment 9 according to the present invention.

FIG. 9 is an explanatory cross sectional view of a solid particle erosion resistant surface treated coating 109 of the embodiment 9 according to the present invention. The solid particle erosion resistant surface treated coating 109 of the present embodiment is constructed by the nitrided hard layer 2, that is the same as described with respect to the embodiment 1, formed on the base material 3 and the PVD hard layer 1 that is formed thereon in a multi-layer form in which the CrN layers 11 and AlCrN layers 13 are alternately layered by the PVD. Thickness of each of the layers forming the PVD hard layer 1 can be set variously, for example, to 10 to 100 nm and the total thickness of the PVD hard layer 1 is 10 μm or more, and preferably 20 μm or more, as in the case of the embodiment 1.

Embodiment 10

Figure 10:
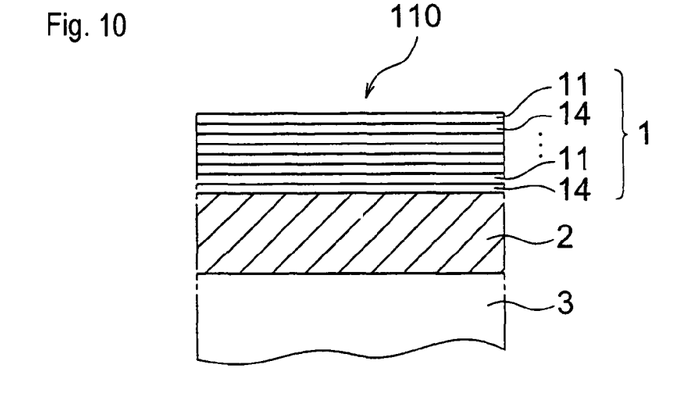
FIG. 10 is an explanatory cross sectional view of a solid particle erosion resistant surface treated coating 110 of embodiment 10 according to the present invention.

FIG. 10 is an explanatory cross sectional view of a solid particle erosion resistant surface treated coating 110 of the embodiment 10 according to the present invention. The solid particle erosion resistant surface treated coating 110 of the present embodiment is constructed by the nitrided hard layer 2, that is the same as described with respect to the embodiment 1, formed on the base material 3 and the PVD hard layer 1 that is formed thereon in a multi-layer form in which the TiN layers 14 and CrN layers 11 are alternately layered by the PVD. Thickness of each of the layers forming the PVD hard layer 1 can be set variously, for example, to 10 to 100 nm and the total thickness of the PVD hard layer 1 is 10 μm or more, and preferably 20 μm or more, as in the case of the embodiment 1.

Embodiment 11

Figure 11:
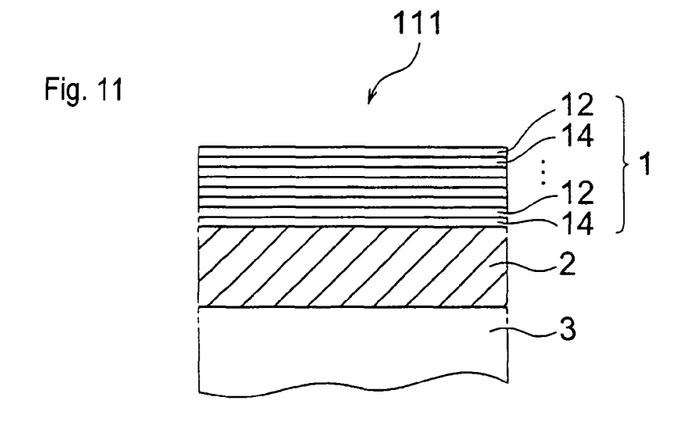
FIG. 11 is an explanatory cross sectional view of a solid particle erosion resistant surface treated coating 111 of embodiment 11 according to the present invention.

FIG. 11 is an explanatory cross sectional view of a solid particle erosion resistant surface treated coating 111 of the embodiment 11 according to the present invention. The solid particle erosion resistant surface treated coating 111 of the present embodiment is constructed by the nitrided hard layer 2, that is the same as described with respect to the embodiment 1, formed on the base material 3 and the PVD hard layer 1 that is formed thereon in a multi-layer form in which the TiN layers 14 and TiAlN layers 12 are alternately layered by the PVD. Thickness of each of the layers forming the PVD hard layer 1 can be set variously, for example, to 10 to 100 nm and the total thickness of the PVD hard layer 1 is 10 μm or more, and preferably 20 μm or more, as in the case of the embodiment 1.

Embodiment 12

Figure 12:
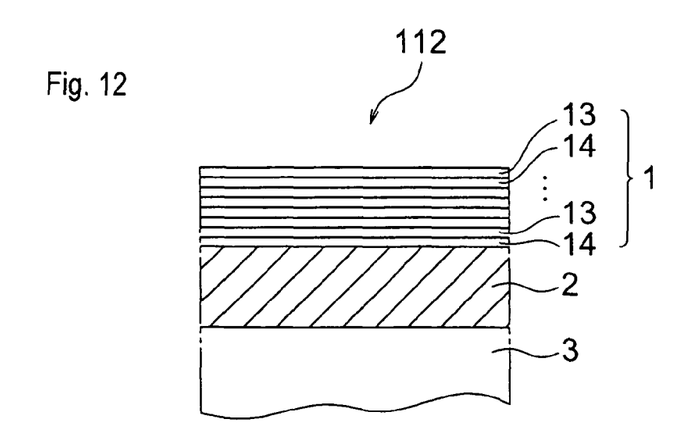
FIG. 12 is an explanatory cross sectional view of a solid particle erosion resistant surface treated coating 112 of embodiment 12 according to the present invention.

FIG. 12 is an explanatory cross sectional view of a solid particle erosion resistant surface treated coating 112 of the embodiment 12 according to the present invention. The solid particle erosion resistant surface treated coating 112 of the present embodiment is constructed by the nitrided hard layer 2, that is the same as described with respect to the embodiment 1, formed on the base material 3 and the PVD hard layer 1 that is formed thereon in a multi-layer form in which the TiN layers 14 and AlCrN layers 13 are alternately layered by the PVD. Thickness of each of the layers forming the PVD hard layer 1 can be set variously, for example, to 10 to 100 nm and the total thickness of the PVD hard layer 1 is 10 μm or more, and preferably 20 μm or more, as in the case of the embodiment 1.

It is to be noted that in the embodiments 1 to 12, while there is no need to limit the PVD method to form the CrN layer 11, TiAlN layer 12, AlCrN layer 13 and TiN layer 14, an arc type ion plating method, for example, is used.

In each of the solid particle erosion resistant surface treated coatings 101 to 112 of the above-mentioned embodiments 1 to 12, the nitrided hard layer 2 formed on the base material 3 is provided for the purpose of enhancing the solid particle erosion resistance of the PVD hard layer 1 formed on the nitrided hard layer 2 by the PVD. That is, while the solid particle erosion resistance is enhanced by applying a coating (the PVD hard layer 1) that has a hardness higher than that of the colliding particles, if the base material (substrate) of the coating is soft, the base material 3 is deformed by collisions by the solid particles so that the upper coat (the PVD hard layer 1) will crack by the deformation and this makes enhancement of the solid particle erosion resistance difficult.

Thus, in order to make full use of the characteristic of the upper PVD hard layer 1, it is necessary to have the substrate sufficiently hardened. For this purpose, the nitrided hard layer 2 is formed on the surface of the base material 3. As for the thickness of the nitrided hard layer 2, an appropriate value thereof is to be sought. If it is less than 30 μm, the above-mentioned deformation of the base material 3 at the time of collisions by the solid particles is caused and the coat including the nitrided hard layer 2 and PVD hard layer 3 will crack, which is not preferable. In order to ensure the solid particle erosion resistance, thickness of the nitrided hard layer 2 of 30 μm or more is necessary. It is to be noted that, as mentioned above, the thickness of more than 100 μm has no physical property-wise problem but is practically disadvantageous because the manufacturing cost becomes high.

Moreover, in the case where a large fatigue stress occurs in operation as on moving blades of a steam turbine, the solid particle erosion resistant surface treated coating must have a strength to withstand such a large stress. For this purpose, the nitrided hard layer 2, if formed by the radical nitriding method, will have no brittle degenerated layer, be strong enough against the fatigue characteristic and have an enhanced fatigue strength as compared with the fatigue characteristic of the base material 3.

In order for the PVD hard layer 1 as the upper layer of the nitrided hard layer 2 to have the solid particle erosion resistance, it is important that the coating thereof has a hardness higher than that of the colliding particles. As $SiO_2$, as the representative material of the colliding particles, has a hardness (Vickers hardness) of 1000 to 1300, a ceramic material that is harder than this is considered appropriate as the material of the PVD hard layer 1.

Thus, as the material forming the PVD hard layer 1 of each of the above-mentioned embodiments 1 to 12, nitride ceramic materials, that is, CrN, TiAlN, AlCrN and TiN, are employed. These materials can satisfy the condition of the above-mentioned hardness and are excellent in high temperature stability (oxidation resistance at 500° C.) and toughness as compared with other ceramic materials, so that they are considered most suitable as the material of the PVD hard layer 1 forming the surface layer of each of the solid particle erosion resistant coatings 101 to 112 of the above-mentioned embodiments 1 to 12.

Also, the PVD hard layer 1 is formed so as to have a total thickness of 10 μM or more. Thereby, the influence of erosion caused by collisions by the solid particles is prevented and the life of the solid particle erosion resistant surface treated coat can be increased.

Moreover, as in the embodiments 8 to 12, the PVD hard layer 1 may be formed in a multi-layer form in which thin materials of two kinds are alternately layered. Thereby, as compared with the PVD hard layer 1 of one layer or two layers, the anti-crack and anti-peeling ability can be further enhanced. That is, in the multi-layer case, even if surface cracks are generated, proceeding direction of the cracks is dispersed toward a plate surface direction (horizontal direction in the figure) from a plate thickness direction between each of the layers and hence the damage caused by the cracks can be suppressed to the minimum. Thus, the solid particle erosion resistance can be further enhanced.

As mentioned above, the solid particle erosion resistant surface treated coating according to the present invention comprises the nitrided hard layer 2 formed on the substrate and the PVD hard layer 1 formed on the nitrided hard layer 2 and by the synergetic effect thereof, succeeds in remarkably enhancing the solid particle erosion resistance. Also, as shown by the comparison test results below, it is excellent in oxidation resistance and fatigue strength as well. Moreover, a rotating machine, such as a steam turbine, axial compressor or the like, having a surface of a part making contact with a high temperature gas having applied thereto the coating of the present invention is excellent at the same time in the solid particle erosion resistance, oxidation resistance and fatigue strength.

Herebelow, results of comparison tests using the embodiments according to the present invention, comparison examples and conventional examples will be described.

(Comparison Test Result 1)

As the base material of test pieces, stainless steel, SUS410J1 (Japanese Industrial Standard), of a size of 30 mm×60 mm×5 mm (thickness) is used. As to the embodiments, the nitrided hard layer is formed on the surface of the base material by the radical nitriding method and the PVD hard layer is formed thereon by the PVD, as mentioned below.

Using the test pieces, sand erosion tests are carried out at room temperature, wherein conical silica sand of average particle size of 326 μm is blasted onto the surface of the test pieces at the velocity of 100 m/s and with the colliding angle each of 30°, 60° and 90°.

From the weight before the test and the weight after the test of the test pieces, an abraded weight of each sample is obtained and this is converted into an abraded volume by the coat density of that sample.

Furthermore, a ratio of the abraded volume of the conventional example, in which the material is SUS410J1 only, relative to the abraded volume of each sample is obtained as an erosion resistance magnification. That is, the erosion resistance magnification shows that as the value thereof becomes larger, that sample is excellent in erosion resistance as compared with the conventional example of the SUS410J1 only.

The radical nitriding treatment is carried out by controlling the time so that the nitrided hard layer is formed with the thickness each of 20, 30, 60 and 100 μm.

The PVD hard layer is formed by an arc type ion plating apparatus, wherein the arc current is 150 A, bias voltage is −30V, gas pressure is 4 Pa and base material temperature is 450° C.

The boronizing treatment of the conventional example is carried out on the condition of 920° C. and 18 hours to thereby form a boronizing treated layer of 70 μm on the surface of the base material and then this sample is applied with a quenching and tempering treatment.

On the conditions mentioned above, 5 samples of (2-1) to (2-5) of the embodiment 2, 1 sample each of the embodiments 3 to 12, 6 samples of the comparison examples 1 to 6 and 2 samples of the conventional examples 1 and 2 are tested. As to the comparison examples, the comparison example 1 has the nitrided hard layer only, the comparison examples 2 to 4 have the nitrided hard layer formed less than 30 μm and the comparison examples 5 and 6 have the PVD hard layer formed less than 10 μm. Also, as to the conventional examples, the conventional example 1 comprises the base material only and the conventional example 2 has the base material surface applied with the boronizing treatment.

The test conditions and results thereof (the erosion resistance magnification) are shown in Table 1 "Comparison Test Result 1".

TABLE 1

[Comparison Test Result 1]

| | | Nitride Hard Layer | | PVD Hard Layer | | | | | Multi-Layer Case | |
| | | | | One-Layer Case or Two-Layer Case | | | | | Thickness of | |
| | Nos. | Applied or not Applied | Thickness (μm) | Material a | Thickness of Material a (μm) | Material b | Thickness of Material b (μm) | Total Thickness (μm) | Material a | Material a per Layer (nm) |
|---|---|---|---|---|---|---|---|---|---|---|
| Embodiments | 2-1 | Applied | 30 | CrN | 10 | — | — | 10 | — | — |
| | 2-2 | Applied | 60 | CrN | 10 | — | — | 10 | — | — |
| | 2-3 | Applied | 60 | CrN | 25 | — | — | 25 | — | — |

TABLE 1-continued

[Comparison Test Result 1]

|   |   |   |   |   |   |   |   |   |   |   |
|---|---|---|---|---|---|---|---|---|---|---|
|   | 2-4 | Applied | 100 | CrN | 10 | — | — | 10 | — | — |
|   | 2-5 | Applied | 100 | CrN | 25 | — | — | 25 | — | — |
|   | 3 | Applied | 100 | CrN | 20 | TiAlN | 3 | 23 | — | — |
|   | 4 | Applied | 100 | CrN | 20 | AlCrN | 3 | 23 | — | — |
|   | 5 | Applied | 100 | TiN | 10 | CrN | 10 | 20 | — | — |
|   | 6 | Applied | 100 | TiN | 10 | TiAlN | 3 | 13 | — | — |
|   | 7 | Applied | 100 | TiN | 10 | AlCrN | 3 | 13 | — | — |
|   | 8 | Applied | 100 | — | — | — | — | — | CrN | 100 |
|   | 9 | Applied | 100 | — | — | — | — | — | CrN | 100 |
|   | 10 | Applied | 100 | — | — | — | — | — | TiN | 100 |
|   | 11 | Applied | 100 | — | — | — | — | — | TiN | 100 |
|   | 12 | Applied | 100 | — | — | — | — | — | TiN | 100 |
| Comparison | 1 | Applied | 60 | — | — | — | — | — | — | — |
| Examples | 2 | Applied | 20 | CrN | 10 | — | — | 10 | — | — |
|   | 3 | Applied | 20 | CrN | 25 | — | — | 25 | — | — |
|   | 4 | Applied | 20 | CrN | 20 | TiAlN | 3 | 23 | — | — |
|   | 5 | Applied | 100 | CrN | 5 | — | — | 5 | — | — |
|   | 6 | Applied | 100 | CrN | 5 | TiAlN | 3 | 8 | — | — |
| Conventional | 1 |   |   |   | SUS410J1 Base Material Only |   |   |   |   |   |
| Examples | 2 |   |   |   | SUS410J1 Base Material having Surface applied with Boronizing Treatment 70 μm |   |   |   |   |   |

| | | PVD Hard Layer Multi-Layer Case | | | | |
|---|---|---|---|---|---|---|
| | | | Thickness of | | Erosion Resistance Magnification | |
| | Nos. | Material b | Material b per Layer (nm) | Total Thickness (nm) | Colliding Angle 30 (deg.) | Colliding Angle 60 (deg.) | Colliding Angle 90 (deg.) |
| Embodiments | 2-1 | — | — | — | 25 | 6 | 4 |
| | 2-2 | — | — | — | 26 | 7 | 4 |
| | 2-3 | — | — | — | 28 | 8 | 5 |
| | 2-4 | — | — | — | 30 | 6 | 4 |
| | 2-5 | — | — | — | 31 | 8 | 5 |
| | 3 | — | — | — | 34 | 9 | 5 |
| | 4 | — | — | — | 38 | 10 | 6 |
| | 5 | — | — | — | 26 | 7 | 4 |
| | 6 | — | — | — | 29 | 8 | 5 |
| | 7 | — | — | — | 30 | 8 | 5 |
| | 8 | TiAlN | 100 | 15 | 35 | 9 | 6 |
| | 9 | AlCrN | 100 | 15 | 37 | 9 | 6 |
| | 10 | CrN | 100 | 15 | 26 | 7 | 4 |
| | 11 | TiAlN | 100 | 15 | 29 | 8 | 6 |
| | 12 | AlCrN | 100 | 15 | 31 | 9 | 6 |
| Comparison | 1 | — | — | — | 1.4 | 0.7 | 0.5 |
| Examples | 2 | — | — | — | 5.0 | 2.0 | 0.9 |
| | 3 | — | — | — | 6.0 | 3.0 | 1.5 |
| | 4 | — | — | — | 7.0 | 3.0 | 2.2 |
| | 5 | — | — | — | 1.9 | 1.2 | 0.7 |
| | 6 | — | — | — | 4.0 | 1.7 | 0.8 |
| Conventional | 1 | SUS410J1 Base Material Only | | | 1.0 | 1.0 | 1.0 |
| Examples | 2 | SUS410J1 Base Material having Surface applied with Boronizing Treatment 70 μm | | | 3.7 | 1.6 | 1.1 |

As shown by the erosion resistance magnifications of Table 1 "Comparison Test Result 1", it is found that the solid particle erosion resistant surface treated coatings of the embodiments according to the present invention are remarkably excellent, as compared with the conventional examples comprising the base material of SUS410J1 only or having the base material surface applied with the boronizing treatment.

Also, it is found that the cases where the nitrided hard layer only is applied but no PVD hard layer is applied (Comparison Example 1), both of the nitrided hard layer and PVD hard layer are applied but the nitrided hard layer is less than 30 μm (that is, 20 μm) (Comparison Examples 2 to 4) and both of the nitrided hard layer and PVD hard layer are applied but the PVD hard layer is less than 10 μm (that is, 5 μm and 8 μm) (Comparison Examples 5 and 6) are largely inferior to each of the embodiments in the erosion resistance magnification so that such a sufficient solid particle erosion resistance as in the embodiments cannot be obtained.

(Comparison Test Result 2)

As the base material of test pieces, stainless steel, SUS410J1 (Japanese Industrial Standard), of a size of 20 mm×20 mm×5 mm (thickness) is used. As to the embodiments, the nitrided hard layer is formed on the surface of the base material by the radical nitriding method and the PVD hard layer is formed thereon by the PVD, as mentioned below.

The test pieces are held in a high temperature steam atmosphere and their oxidation resistances are investigated.

The radical nitriding treatment is carried out by controlling the time so that the nitrided hard layer is formed with the thickness of 60 μm.

The PVD hard layer is formed by an arc type ion plating apparatus, wherein the arc current is 150 A, bias voltage is −30V, gas pressure is 4 Pa and base material temperature is 450° C.

The boronizing treatment of the conventional example is carried out on the condition of 920° C. and 18 hours to thereby form a boronizing treated layer of 70 μm on the surface of the base material and then this sample is applied with a quenching and tempering treatment.

On the conditions mentioned above, 1 sample each of the embodiments 2 and 3, 1 sample of the comparison example 1 and 2 samples of the conventional examples 1 and 2 are tested. The comparison example 1 has the nitrided hard layer only and no PVD hard layer, the conventional example 1 comprises the base material only and the conventional example 2 has the base material surface applied with the boronizing treatment.

The test conditions and results thereof (ratio of the oxidized layer thickness) are shown in Table 2 "Comparison Test Result 2".

TABLE 2

[Comparison Test Result 2]

|  | Nos. | Nitrided Hard Layer | PVD Layer (one-layer) (μm) | Ratio of Oxidized Layer Thickness at 450° C. |
|---|---|---|---|---|
| Embodiments | 2 | Radical Nitriding 100 μm | CrN 25 mμm | 0.02 |
|  | 3 | Radical Nitriding 100 μm | CrN(10 μm) + TiAlN(3 μm) | 0.01 |
| Comparison Example | 1 | Radical Nitriding 100 μm | — | 5.0 |
| Conventional Examples | 1 | SUS410J1 only | | 1.0 |
|  | 2 | SUS410J1 having Surface applied with Boronizing Treatment 70 μm | | 0.5 |

It is to be noted that in Table 2 "Comparison Test Result 2", the oxidation resistance is shown by the ratio of the oxidized layer thickness relative to the case where the oxidized layer thickness of SUS410J1 is set to 1. As shown by the relative ratio of the oxidized layer thickness of Table 2, it is found that the oxidation resistance of the solid particle erosion resistant surface treated coatings of the embodiments according to the present invention is remarkably excellent, as compared with the comparison example having the nitrided hard layer only formed by the radical nitriding as well as the conventional example.

(Comparison Test Result 3)

A test piece of the embodiment 2 having the nitrided hard layer (60 μm) formed by the radical nitriding and the CrN layer (25 μm) formed thereon and a test piece of the conventional example having the base material of SUS410J1 only without the surface treatment are prepared and rotating bending fatigue tests are carried out at 450° C.

As the result, as compared by the fatigue strength at 107 cycles, it is found that the test piece having the nitrided hard layer (60 μm) and CrN layer (25 μm) has a fatigue strength enhanced by 13% as compared with the conventional example. Thus, it is understood that the solid particle erosion resistant surface treated coating of the embodiment according to the present invention has an excellent fatigue strength as well.

As mentioned above, according to the solid particle erosion resistant surface treated coating of each of the embodiments of the present invention, the nitrided hard layer of thickness of 30 μm or more is formed on the base material and the PVD hard layer of thickness of 10 μm or more is formed on the nitrided hard layer. Thereby, an extraordinarily high resistance against collisions by the solid particles can be obtained. Also, the erosion resistance of parts and components applied with the coating of the present invention can be remarkably enhanced and their life can be largely elongated.

Further, the solid particle erosion resistant surface treated coating of the present invention is excellent in the high temperature oxidation resistance and fatigue characteristic as well. Hence, in a steam turbine, if the coating of the present invention is applied to the surface of parts and components making contact with steam so that solid particles included in the steam collide therewith, a steam turbine having an enhanced high temperature oxidation resistance and fatigue characteristics, as well as having an increased life can be realized. Also, by applying the coating of the present invention to parts and components of a rotating machine, such as an axial compressor, the life of the machine can be largely increased.

In the foregoing, while the present invention has been described based on the embodiments as illustrated, the present invention is by no means limited thereto but, as a matter of course, may be added with various modifications in the construction. Also, while the steam turbine according to the present invention is not illustrated, the solid particle erosion resistant surface treated coating of the present invention is not limited to a steam turbine having a specific structure but may be generally applied to a part having a surface making contact with steam in a usual steam turbine.

What is claimed is:

1. A solid particle erosion resistant surface treated coating comprising:
    a nitrided hard layer formed on a surface of a base material; and
    a physical vapor deposition (PVD) hard layer of at least one layer formed on said nitrided hard layer by a PVD method, wherein
    said nitrided hard layer has a thickness of at least 30 μm and said PVD hard layer has a total thickness of at least 10 μm,
    said nitrided hard layer is formed by a radical nitriding method, and
    the PVD hard layer comprises at least one of an AlCrN layer and a TiAlN layer.

2. A solid particle erosion resistant surface treated coating as claimed in claim 1, wherein said PVD hard layer comprises a CrN layer formed on said nitrided hard layer and said at least one of said AlCrN layer and said TiAlN layer formed on said CrN layer.

3. A solid particle erosion resistant surface treated coating as claimed in claim 1, wherein said PVD hard layer comprises a TiN layer formed on said nitrided hard layer and said at least one of said AlCrN layer and said TiAlN layer formed on said TiN layer.

4. A solid particle erosion resistant surface treated coating as claimed in claim 1, wherein said PVD hard layer is formed on said nitrided hard layer in a multi-layer form in which CrN layers and said TiAlN layers are alternately layered.

5. A solid particle erosion resistant surface treated coating as claimed in claim 1, wherein said PVD hard layer is formed on said nitrided hard layer in a multi-layer form in which CrN layers and said AlCrN layers are alternately layered.

6. A solid particle erosion resistant surface treated coating as claimed in claim 1, wherein said PVD hard layer is formed on said nitrided hard layer in a multi-layer form in which TiN layers and said TiAlN layers are alternately layered.

7. A solid particle erosion resistant surface treated coating as claimed in claim 1, wherein said PVD hard layer is formed on said nitrided hard layer in a multi-layer form in which TiN layers and said AlCrN layers are alternately layered.

8. A rotating machine comprising a part that comes into contact with steam, the part having a surface that has the solid particle erosion resistant surface treated coating as claimed in claim 1 applied thereto.

9. A rotating machine comprising a part that comes into contact with steam, the part having a surface that has the solid particle erosion resistant surface treated coating as claimed in claim 2 applied thereto.

10. A rotating machine comprising a part that comes into contact with steam, the part having a surface that has the solid particle erosion resistant surface treated coating as claimed in claim 3 applied thereto.

11. A rotating machine comprising a part that comes into contact with steam, the part having a surface that has the solid particle erosion resistant surface treated coating as claimed in claim 4 applied thereto.

12. A rotating machine comprising a part that comes into contact with steam, the part having a surface that has the solid particle erosion resistant surface treated coating as claimed in claim 5 applied thereto.

* * * * *